United States Patent
Eitan et al.

(10) Patent No.: US 10,340,938 B1
(45) Date of Patent: Jul. 2, 2019

(54) ANALOG TO DIGITAL CONVERTOR (ADC) USING A COMMON INPUT STAGE AND MULTIPLE PARALLEL COMPARATORS

(71) Applicant: Intel Corporation, Santa Clara, CA (US)

(72) Inventors: Roee Eitan, Jerusalem (IL); Ram Livne, Ramat Raziel (IL); Ahmad Khairi, Hillsboro, OR (US); Yoel Krupnik, Jerusalem (IL); Ariel Cohen, Modiin-Makkabbim-Reut (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/961,460

(22) Filed: Apr. 24, 2018

(51) Int. Cl.
| H03K 5/22 | (2006.01) |
| H03M 1/12 | (2006.01) |
| H03M 1/38 | (2006.01) |
| H03K 3/037 | (2006.01) |

(52) U.S. Cl.
CPC .............. H03M 1/38 (2013.01); H03K 3/037 (2013.01); H03K 5/22 (2013.01); H03M 1/1245 (2013.01)

(58) Field of Classification Search
CPC ........ H03M 1/38; H03M 1/1245; H03K 5/22; H03K 3/037
USPC .................................................. 341/155, 110
See application file for complete search history.

(56) References Cited

U.S. PATENT DOCUMENTS

| 5,594,445 | A | * | 1/1997 | Ginetti | H03M 1/0682 341/162 |
| 5,710,563 | A | * | 1/1998 | Vu | H03M 1/0663 341/155 |
| 6,987,477 | B1 | * | 1/2006 | Aude | H03M 1/0695 341/155 |
| 7,183,812 | B2 | * | 2/2007 | Nairn | H03K 5/2481 327/52 |

OTHER PUBLICATIONS

Kull, Lukas et al., "A 10b 1.5GS/s Pipelined-SAR ADC with Background Second-Stage Common-Mode Regulation and Offset Calibration in 14nm CMOS FinFET", ISSCC 2017 / Session 28 / Hybrid ADCS / 28.5.
Kull, Lukas et al., "A 3.1mW 8b 1.2GS/s Single-Channel Asynchronous SAR ADC with Alternate Comparators for Enhanced Speed in 32nm Digital SOI CMOS", ISSCC 2013 / Session 26 / High-Speed Data Converters / 26.4.

* cited by examiner

Primary Examiner — Brian K Young
(74) Attorney, Agent, or Firm — Green, Howard & Mughal LLP

(57) ABSTRACT

An Analog to Digital (ADC) is provided, where the ADC may include a sample and hold circuitry to sample an analog input signal, and a summation block to iteratively generate a subtraction signal. The subtraction signal may be based on a difference between the analog input signal and a feedback signal. The ADC may further include a common input stage to receive the subtraction signal, and a plurality of comparison and latch circuitries arranged in parallel, where individual ones of the plurality of parallel comparison and latch circuitries may sequentially receive an output of the common input stage.

25 Claims, 13 Drawing Sheets

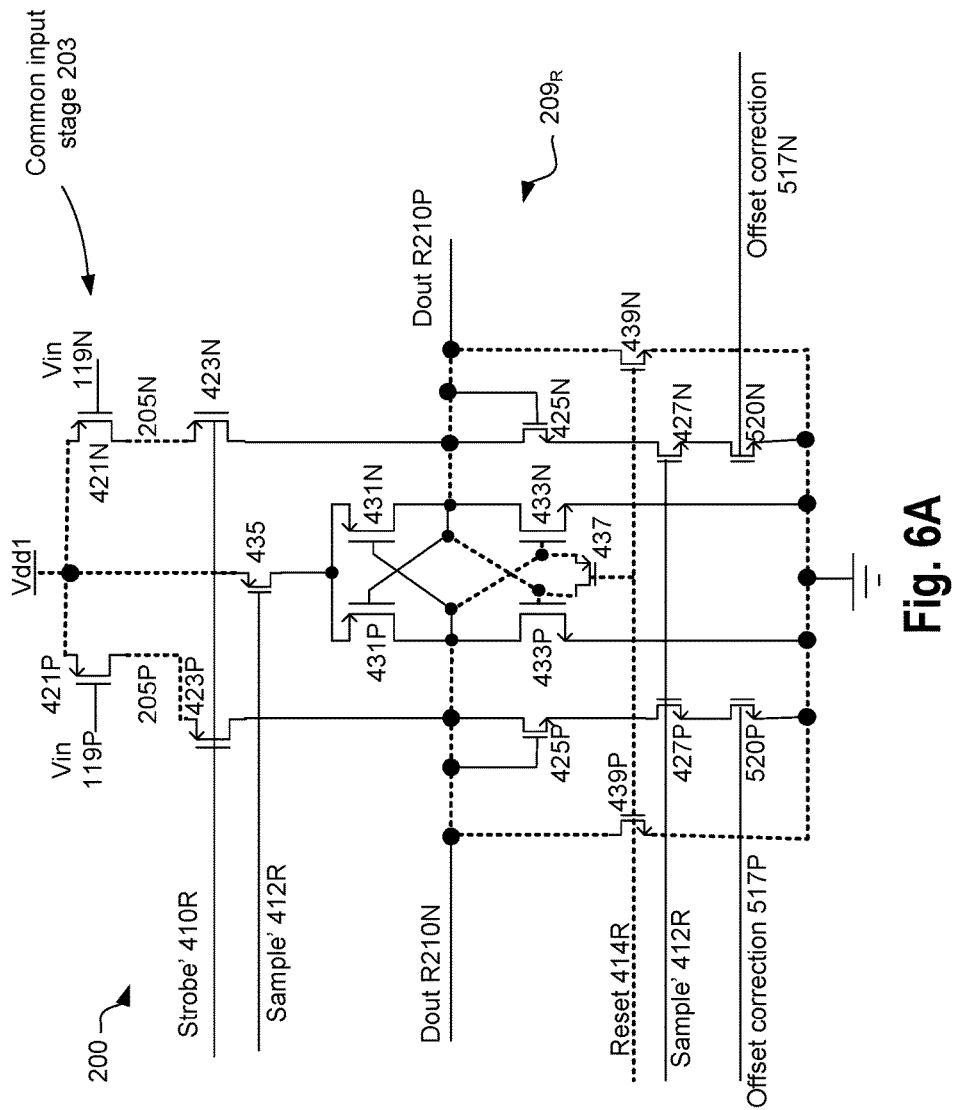

ANALOG TO DIGITAL CONVERTOR (ADC) USING A COMMON INPUT STAGE AND MULTIPLE PARALLEL COMPARATORS

BACKGROUND

An Analog-to-Digital Converter (ADC) is a system that converts an analog signal into a corresponding digital signal. ADCs are used in a plethora of computing devices. A successive-approximation register (SAR) based ADC uses a comparator to successively narrow a range that contains the analog input voltage, to generate the digital output voltage.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 6A-6E illustrate example operations of an ADC, according to some embodiments.

DETAILED DESCRIPTION

Figure 1:
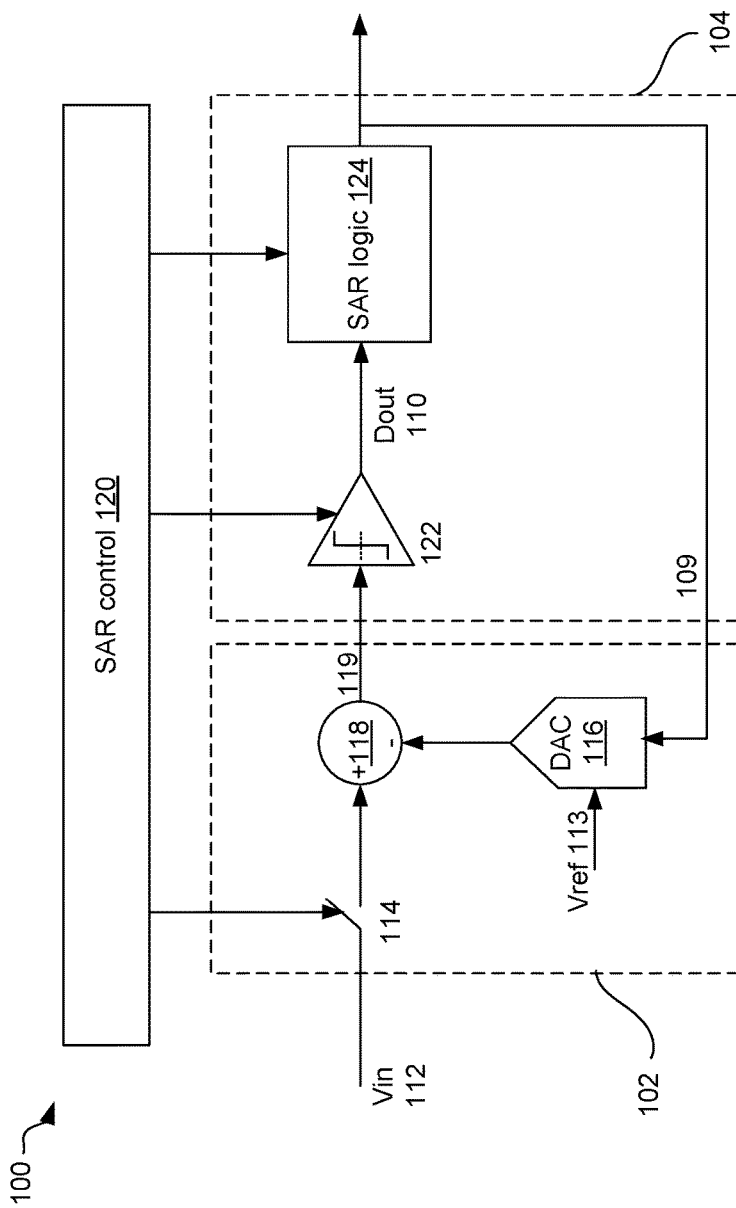
FIG. 1 illustrates an Analog-to-Digital Converter (ADC) employing Successive Approximation Register (SAR) techniques for analog to digital conversion, where at least a section of the ADC is to be parallelized, according to some embodiments.

In some embodiments, a SAR based ADC is proposed, where the ADC may comprise a plurality of parallel comparison and latch circuitries, and a common trans-conductance input stage. As will be discussed in details herein later, each parallel comparison and latch circuitry may compare differential outputs of a summation circuitry, and regenerate (e.g., amplify) and maintain a result of the comparison. In some embodiments, because a single common trans-conductance input stage is used for all the parallel comparison and latch circuitries, loading of a Digital to Analog Converter (DAC) and/or a sample and hold circuitry of the ADC may be low.

In some embodiments, a completion of comparison and latching operation of a comparison and latch circuitry may trigger initiation of comparison and latching operation of a next comparison and latch circuitry. Thus, for example, the comparison and latch circuitries are activated sequentially, e.g., similar to a domino effect, without a separate complex SAR logic monitoring the sequential activations. In some other embodiments, a SAR logic may synchronously trigger initiation of comparison and latching operations of various comparison and latch circuitries.

As will be discussed in details herein later, the proposed ADC may retain various advantages of a single-comparator based SAR ADC, while achieving the speed of a multiple-comparator based SAR ADC. Other technical effects will be evident from the various embodiments and figures.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or"

as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single transistor.

It is pointed out that those elements of the figures having the same reference numbers (or names) as the elements of any other figure can operate or function in any manner similar to that described, but are not limited to such.

FIG. 1 illustrates an ADC 100 employing Successive Approximation Register (SAR) techniques for analog to digital conversion, where at least a section of the ADC 100 is to be parallelized, according to some embodiments. In an example, the ADC 100 receives an analog voltage Vin 112, and outputs a digital representation Dout 110 of the analog voltage Vin 112. In an example, the ADC 100 comprises a first section 102 and a second section 104, where the section 104 is to be at least in part parallelized in subsequent figures and description of this disclosure.

Here, the term "analog signal" (e.g., a current or voltage) is any continuous signal for which the time varying feature (variable) of the signal is a representation of some other time varying quantity, i.e., analogous to another time varying signal. Here the term "digital signal" is a physical signal that is a representation of a sequence of discrete values (a quantified discrete-time signal), for example of an arbitrary bit stream, or of a digitized (sampled and analog-to-digital converted) analog signal.

In an example, the first section 102 comprises a sample and hold circuitry 114, which may also be a track and hold circuitry (e.g., represented as a switch in FIG. 1), which acquires and holds the input Vin 112. The input voltage Vin 112 may be an analog voltage.

The analog to digital conversion may be performed iteratively, e.g., using R number of successive comparison operations, where Dout 110 may have R bits. The SAR logic 124 is initialized (e.g., during a first comparison operation) so that the bits of the Dout 110 are equal to zero. The Dout 110 is fed back into the first section 102 via a Digital to Analog Convertor (DAC) 116 as signal 109, where the DAC 116 also receives a reference voltage Vref 113. The DAC 116 supplies an analog equivalent of this digital code. A summation block 118 determines a difference between Vin 112 and the output of the DAC 116. An output 119 of the summation block 118 (e.g., where the output 119 is also referred to herein as a subtraction signal, or a difference signal) is provided to a comparator 112, which compares the output 119 of the summation block 118 to a zero voltage. Based on the comparison, the Most Significant Bit (MSB) of Dout 109 is set to zero or one.

Then (e.g., during a second comparison operation) the next bit (e.g., the bit next to the MSB) is to be set, and the same test is done, continuing this binary search until every bit in the Dout 110 has been tested. The resulting code (e.g., after every bit of the Dout 110 has been tested and after the R number of comparison operations have ended) is a digital approximation of the sampled input voltage, and is finally output by the SAR at an end of the conversion (EOC).

In some embodiments, a SAR control circuitry 120 may control the various components of the ADC 100, as illustrated in FIG. 1. For example, the SAR control circuitry 120 may trigger operations of various components (e.g., sample and hold circuitry 114, DAC 116, etc.) of the ADC 100.

In an example, the DAC 116, the sample and hold 114 and/or the summation block 118 may be implemented using a shared switched-capacitor network.

In some embodiments, if the Dout 110 has R bits, then for individual ones of the R bits, the comparator 122 may compare and the SAR logic 124 may update the bit. The comparison has to be done serially, e.g., one after another (e.g., as a single comparator is used for comparison, and because a result of a comparison for a given bit may affect a comparison of the next bit). For example, assume that the Dout 110 has 4 bits, and initially the $4^{th}$ bit (which may be the MSB) may be estimated during a first iteration. Based on a result of the comparison result of the first iteration, the Dout for the next iteration for the $3^{rd}$ bit may be set to either 1000 or 0000.

Comparing the R bits in a strictly serial fashion (e.g., using a single comparator 122) may be time consuming. In an example, a maximum design space (e.g., characterized by power, performance, speed etc.) of SAR topologies based on a single comparator may be limited, despite extensive process scaling. This may be due to a delay of the comparator itself (e.g., sampling and reset times), as well as the delays from logic blocks used to control the DAC 116.

For example, a disadvantage of the single-comparator topology (e.g., comprising the single comparator 124) may be speed and complexity. The comparator 122 needs to make a decision, and then reset before making its next decision, which may set a limit to a maximum speed of the comparator 124. Additionally, the logic (e.g., logic 124) to control the DAC 116 may be based on the decision of the comparator 122, and the decisions has to keep track of the bit number as well as the comparator changes, e.g., in order to update the DAC 116 accordingly. Such logic tends to be complex, and may result in added latency, which may further reduce the speed.

In order to increase the speed of the ADC 100, the speed of the comparator 124 may be increased. However, this increased speed up may come at an expense of increased power and/or noise. This tradeoff between speed and sensitivity of the ADC 100 may create a physical limit, which may be mitigated by architectural changes (e.g., replacing the comparator 124 with a plurality of parallel comparators).

In some embodiments and as discussed in further details in this disclosure, in order to increase the speed and reduce logical complexities in the ADC 100, a dual-comparator SAR architecture, or even a multi-comparator SAR architecture may be used. By using more than one comparator in the ADC 100, reset delays in the comparator may be eliminated or reduced, and setup time requirements may be relatively eased. Additionally, in the case where R number of comparators are used to implement R bit SAR, the SAR logic 124 may also be eliminated in some examples, which may result in further speed improvement.

Multi-comparator ADCs are proposed in this disclosure, which may comprise multi-comparator avalanche type SAR ADC. The multiple-comparator ADC may comprise a Switched Common Input, Multi-latched Avalanche SAR. Such an ADC may exploit the advantages of multi-comparator SAR design, while simultaneously maintaining advantages of single-comparator SAR. For example, the ADCs proposed herein may be a common trans-conductance input stage (e.g., with differential pair signaling), and switching between multiple latches, where each latch may work as a corresponding separate comparator. So, as discussed herein later in further details, the DAC may be loaded by a single differential pair of common input stage, while the ADC may comprise multiple parallel comparators. For example, referring again to FIG. 1, in some embodiments, the second section 104 of the ADC 104 may be replaced by plurality of parallel comparators, as discussed with respect to FIG. 2.

Figure 2:
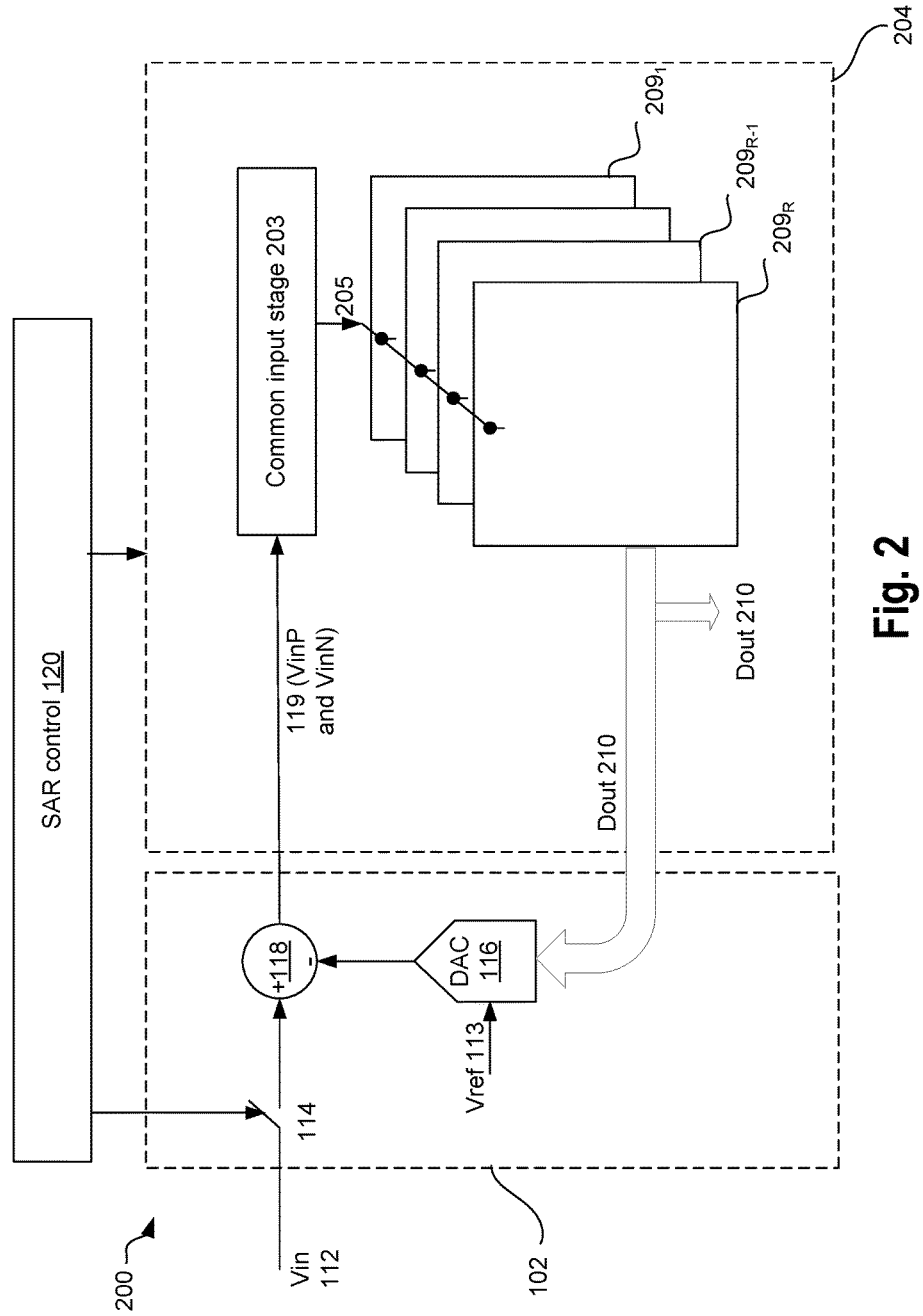
FIG. 2 illustrates an ADC comprising a plurality of circuitries comprising a corresponding plurality of comparators, and a common input stage to feed individual ones of the plurality of circuitries, according to some embodiments.

FIG. 2 illustrates an ADC 200 comprising a plurality of circuitries $209_1, \ldots, 209_R$ comprising a corresponding plurality of comparators and latches, and a common input stage 203 to feed individual ones of the plurality of circuitries $209_1, \ldots, 209_R$, according to some embodiments. In some embodiments, the ADC 200 may be used in any appropriate computing devices, e.g., a laptop, a desktop, a cellular phone, a smart phone, a base station, an Internet of Thing (IoT), a wearable device, a consumer electronic device, a Serializer/Deserializer (e.g., a high speed, high resolution, low power ADC based SerSerDes), an Ethernet PHY (Physical Layer), an ultra-high speed Ethernet PHY, a computing device comprising one or more sensors (e.g., the ADC may be used to convert an analog output of a sensor), and/or any appropriate computing device employing a ADC.

Elements referred to herein with a common reference label followed by a particular number or alphabet may be collectively referred to by the reference label alone. For example, circuitries $209_1, \ldots, 209_R$ may be collectively and generally referred to as circuitries 209 in plural, and circuitry 209 in singular.

In FIG. 2, R number of circuitries 209 respectively comprising corresponding R number of comparators and latches are illustrated, where R is an integer. Merely as an example, four circuitries respectively comprising corresponding four comparators and latches are illustrated in FIG. 2 (e.g., in FIG. 2, R=4), although the ADC 200 may comprise any other appropriate number of circuitries.

In some embodiments, the number R of the circuitries 209 may be equal to a number of bits of an output Dout 210 of ADC 200. Thus, if Dout 210 has R bits, then the ADC 200 may comprise at most R number of circuitries 209. In some embodiments, the ADC 200 may comprise less number of circuitries 209, e.g., less than the number of bits of the Dout 210 (but more than one comparator). Thus, in such examples, the number of circuitries 209 may be higher than one, and less than or equal to the number of bits R of the Dout 210. However, for purposes of this disclosure and without limiting the teachings of this disclosure (and unless otherwise stated), it is assumed herein that the number R of the circuitries 209 respectively comprising R number of comparators may be equal to the number of bits R of the output Dout 210 of ADC 200 (e.g., one circuitry 209 per bit of the output Dout 210).

In some embodiments, the ADC 200 may comprise the first section 102, which may correspond to the first section 102 of the ADC 100 of FIG. 1. For example, similar to FIG. 1, the first section 102 of the ADC 200 of FIG. 2 comprises the sample and hold circuitry 114, the summation circuitry 118, and the DAC 116.

The ADC 200 may also comprise a second section 204 (e.g., which may be at least in part a parallelized version of the second section 104 of FIG. 1). In some embodiments, a common input stage 203 (e.g., which may be a trans-conductance stage) of the second section 204 may receive the output 119 of the summation block 118, may generate current signal 205 that is representative of the output 119, and transmit the signal 205 to individual ones of the circuitries 209. Thus, individual ones of the circuitries 209 may receive a version 205 of the signal 119 from the summation block 118, e.g., via the common input stage 203. In some embodiments, the common input stage 203 may act as a trans-conductance input stage, may provide current input to each current driven comparator stages (e.g., each of the circuitries 209), and provide first level of buffering of the input 119.

The circuitries 209 may output Dout 210, which may be the digital approximation of the analog input Vin 112. During various comparison iterations for transforming the analog input Vin 112 to the digital output 210, the intermediate value of the digital output 210 may be fed-back to the DAC 116, e.g., as discussed with respect to FIG. 1. In some example (and unlike the ADC 100 of FIG. 1), no SAR logic may be used in the ADC 200 of FIG. 2 to feed back the Dout 210 to the DAC 116.

In some embodiments, the ADC 200 may, at a high level, operate as follows. Initially, the circuitry $209_R$ may be activated (e.g., while the other comparator circuitries 209 may be reset or inactive), the bits of Dout 210 may be reset to zero (e.g., if R=4, then Dout 210 may be 0000). The value 0000 of Dout 110 is fed back into the first section 102 via the DAC 116, which also receives the reference voltage Vref 113. The DAC 116 supplies an analog equivalent of this digital code. The summation block 118 determines a difference between Vin 112 and the output of the DAC 116. The output 119 of the summation block 118 is converted to a current signal 205, which is provided to the comparator of the circuitry $209_R$. The comparator of the circuitry $209_R$ compares the differential output 205, to estimate a MSB of the Dout 210 (e.g., estimates whether the MSB of Dout 210 is 1 or 0).

During the second iteration, the value of the MSB may be fed-back to the DAC 116 (e.g., Dout 210 is 1000 or 0000, based on the estimated value of the MSB), and the circuitry $209_{R-1}$ is activated (e.g., during this iteration, the signal 205 is supplied to the circuitry $209_{R-1}$), which now estimates the $(MSB-1)^{th}$ bit. This process continues iteratively, until all the bits of Dout 210 is estimated. The resulting code (e.g., after every bit of the Dout 210 has been tested) is a digital approximation of the sampled input voltage, and is finally output by the ADC 200 at an end of the conversion.

In some embodiments, the ADC 200 may be implemented using differential signaling. Thus, the output 119 may have a positive and negative component (e.g., Vin 119P and Vin 119N). Thus, in such embodiments, the circuitry $209_R$ may compare the voltages 119P and 119N, to determine a corresponding bit of the Dout 210.

Thus, in the ADC 200, the circuitries 209 are activated sequentially, one after another. When a circuitry 209 (e.g., a circuitry $209_k$, where K is an index that varies from 1, . . . , R) is activated, it performs a comparison to determine a value of a $k^{th}$ bit of Dout 210 and/or to generate a $k^{th}$ feed-back to the DAC 210. Also, when the circuitry $209_k$ is activated, the common input stage 203 may transmit the signal 205 to the circuitry $209_k$, while the other circuitries 209 (e.g., circuitries $209_{k+1}$, $209_{k-1}$, $209_1$, etc.) are inactive.

Figure 3:
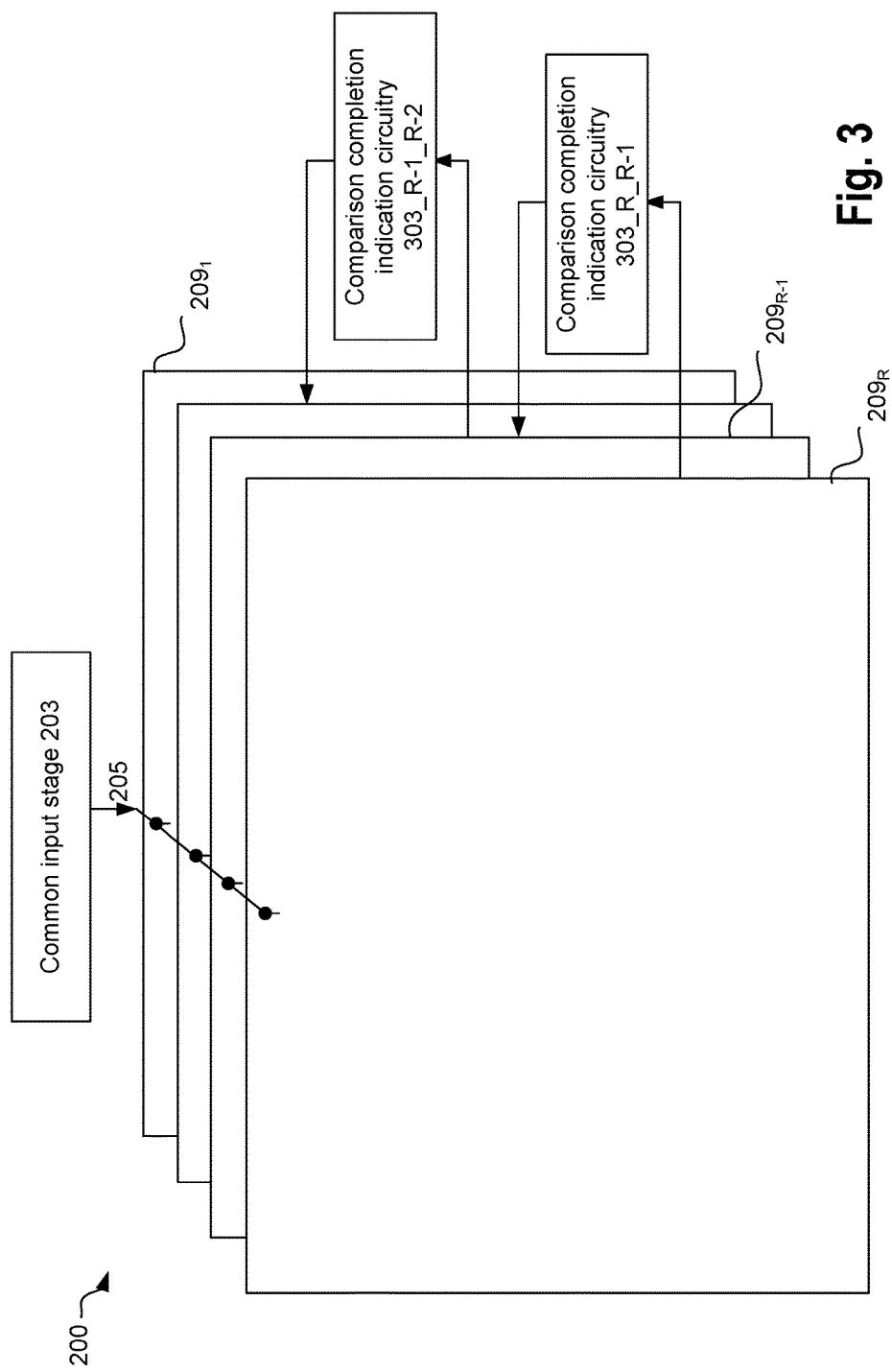
FIG. 3 illustrates the ADC of FIG. 2 comprising a plurality of comparison completion indication circuitries, according to some embodiments.

FIG. 3 illustrates the ADC 200 of FIG. 2 comprising a plurality of comparison completion indication circuitries 303_R_R-1, 303_R-1_R-2, . . . , 303_2_1, etc. (also generally referred to herein as comparison completion indication circuitries 303 in plural, and comparison completion indication circuitry 303 in singular), according to some embodiments. For example, the comparison completion indication circuitry 303_R_R-1 transmits one or more comparison completion indication signals form the circuitry $209_R$ to the circuitry $209_{R-1}$, the comparison completion indication circuitry 303_R-1_R-2 transmits one or more comparison completion indication signals form the circuitry $209_{R-1}$ to the circuitry $209_{R-2}$, the comparison completion indication circuitry 303_1_R transmits one or more comparison completion indication signals form the circuitry $209_1$ to the circuitry $209_{R-1}$, and so on. Note that merely two of the comparison completion indication circuitries 303 are illustrated in FIG. 3.

For example, once the comparison and latch operation in the circuitry $209_R$ is completed, the circuitry $209_R$ transmits one or more completion indication signals to the circuitry $209_{R-1}$ via the comparison completion indication circuitry 303_R_R-1, e.g., such that the circuitry $209_{R-1}$ may initiate its comparison operation. Thus, a circuitry 303 may detect completion of a comparison of a given circuitry 209 (e.g., the circuitry 303_R_R-1 may detect completion of a comparison of the circuitry $209_R$), and may trigger the successive comparison of the next circuitry 209 (e.g., the circuitry 303_R_R-1 may trigger the successive comparison of the next circuitry $209_{R-1}$). This results in a domino effect of the circuitry 209, where one circuitry after another is sequentially activated. Further details of the comparison completion indication circuitries 303 are discussed herein later.

Various examples and embodiments disclosed herein discusses asynchronous triggering of a circuitry $209_{k-1}$ upon on completion of a comparison and latching operation of a previously circuitry $209_k$, e.g., based on an output of a comparison completion indication circuitry 303_k_k-1. However, in some other embodiments, the triggering of various circuitries 209 may be controlled in a synchronous manner, e.g., by a SAR control circuitry 120. In such embodiments, at least some or all the comparison completion indication circuitry 303 may be absent. In such embodiments, the SAR control circuitry 120 may sequentially and synchronously activate the circuitries 209, one after another (e.g., based on a clock signal).

Figure 4:
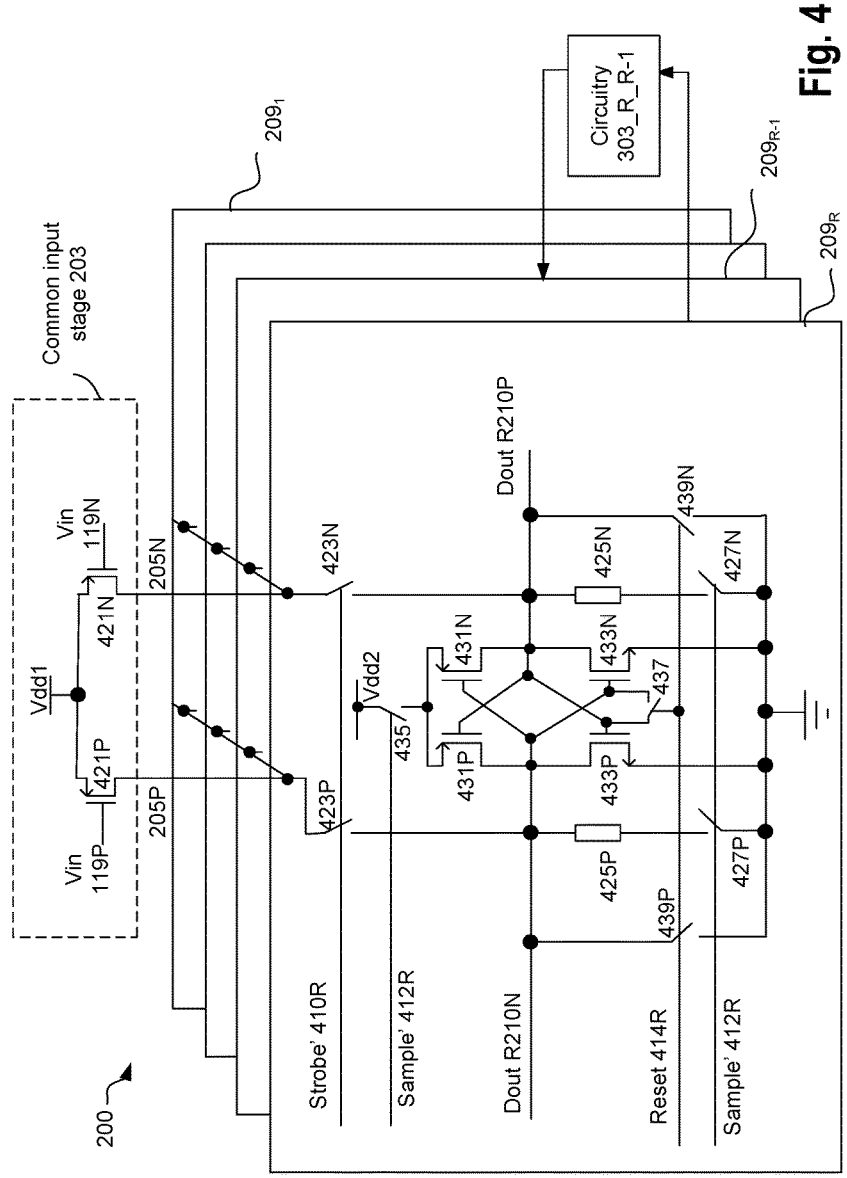
FIG. 4 illustrates an example implementation of a common input stage and a circuitry of the plurality of circuitries of the ADC of FIG. 2, according to some embodiments.

FIG. 4 illustrates an example implementation of the common input stage 203 and an example circuitry 209 (e.g., circuitry $209_R$) of the plurality of circuitries 209 of the ADC 200 of FIG. 2, according to some embodiments. In an example, although FIG. 4 illustrates the example implementation of the circuitry $209_R$, the other circuitries $209_{R-1}$, . . . , $209_1$ may be implemented in a similar manner. In FIG. 4, the circuitry $209_R$ is implemented using differential signaling (although it may be implemented using single ended output signaling in some other examples, and the output Dout 210 may be single ended). In an example, the signal 119 of FIG. 2 (e.g., output of the summation block 118) may be received by the common input stage 203 as Vin 119P and Vin 119P in differential signaling format.

In some embodiments, the common input stage 203 comprises differential pair of transistors 421P and 421N, which are respectively controlled by Vin 119P and Vin 119N. The differential pair of transistors 421P and 421N receive a supply voltage Vdd1, and output differential signals 205P and 205N, respectively. In some embodiments, the common input stage 203 acts as an input trans-conductance stage amplifier, and the current over the differential signals 205P and 205N may represent a version of the output voltage 119 from the summation block 118. In some embodiments, the signals 205P and 205N may be sequentially received by individual ones of the circuitries $209_1, \ldots, 209_R$.

Referring now to the circuitry $209_R$, the circuitry $209_R$ is for determining a $R^{th}$ bit of the Dout 210, which may be a MSB of the Dout 210. For example, a differential output of the circuitry $209_R$ may be Dout R210P and Dout R210N. The signals Dout R210P and Dout R210N may, in combination, define the MSB of the Dout 210. Merely as an example, if Dout R210P is higher than Dout R210N, then the MSB may be 1, else the MSB may be zero. In some embodiments, one or more circuitries (e.g., a set-reset latch, not illustrated in FIG. 4) may be used to convert the differential outputs Dout R210P and R210N to a corresponding single ended output.

The "R" in the labels R210P and R210N of the output Dout implies that the output is for the circuitry $209_R$ and for the $R^{th}$ bit of the Dout. The "P" and "N" in the labels respectively correspond to the positive and negative signals of the differential output. For example, the circuitry $209_{R-1}$ may also have a corresponding output Dout (R-1)210P and Dout (R-1)210N, and so on. Similar labeling rules are also used for various other signals in FIG. 4.

In some embodiments, the signals 205P and 205N are respectively received by switches 423P and 423N, where the switches 423P and 423N are controlled by a strobe' signal 410R. The "R" in the label 410R of the strobe' implies that the strobe' 410R is for the circuitry $209_R$. For example, the circuitry $209_{R-1}$ may have a corresponding strobe' signal 410(R-1), the circuitry $209_{R-2}$ may have a corresponding strobe' signal 410(R-2), and so on.

The output of the switch 423P may be coupled to the Dout R210N, and the output of the switch 423N may be coupled to the Dout R210P. The output Dout R210N may be coupled to the ground terminal via a load 425P and a switch 427P, and the output Dout R210P may be coupled to the ground terminal via a load 425N and a switch 427N. The switches 427P and 427N are controlled by a sample' signal 412R.

In some embodiments, the circuitry $209_R$ may comprise a pair of cross coupled transistors 431P and 431N, and another pair of cross coupled transistors 433P and 433N. In some embodiments, the cross-coupled pair of transistors 431P and 431N form a first inverter, and the cross-coupled pair of transistors 433P and 433N form a second inverter. Thus, the latch comprising the two cross-coupled pair of transistors 431P, 431N, 433P, and 433N form two inverters arranged in a back-to-back inventor arrangement. For example, the first inverter is coupled to the second inverter, and an output of one inverter is coupled to the gates of the other inverter.

For example, sources of the transistors 431P and 431N may be coupled to a supply Vdd2 via a switch 435. The switch 435 may be controlled by the sample' signal 412R. The drains of the transistors 431P and 431N may be coupled to the sources of the transistors 433P and 433N, respectively. Drains of the transistors 433P and 433N may be grounded. A gate of the transistor 431P and a gate of the transistor 433P may be coupled to the output Dout R210P, and a gate of the transistor 431N and a gate of the transistor 433N may be coupled to the output Dout R210N.

In some embodiments, the outputs Dout R210N and Dout R210N may be selectively coupled or shorted via a switch 437. The switch 437 may be controlled by a Reset signal 414R. In some embodiments, the output Dout R210P may be grounded via a switch 439P, and the output Dout R210N may be grounded via a switch 439N. The switches 439P and 439N may be controlled by the Reset signal 414R.

In some embodiments, the circuitry $209_R$ may act as a combination of a comparator and a latch. For example, the circuitry $209_R$ may compare the signals 205P and 205N, which may be amplified differential versions of the output of the summation block 118. In some embodiments, the circuitry $209_R$ may also act to regenerate or amplify the difference and maintain the difference in the outputs DR210P, R210N, e.g., to latch a result of the comparison.

For purposes of this disclosure and unless otherwise mentioned, individual ones of the circuitries 209 may also be referred to herein as a comparison and latch circuitry. For example, there are R number of comparison and latch circuitries $209_R, 209_{R-1}, \ldots, 209_1$. As illustrated in FIG. 4, a comparison and latch circuitry (e.g., comparison and latch circuitries $209_R$) may comprise a switchable latch. The circuitry $209_R$ may comprise: one or more switches (e.g., switches 423P, 423N) connecting the comparison and latch circuitry $209_R$ to the common input stage 203, switchable loads (e.g., loads 425P, 425N that are switchable via switches 427P, 427N), a sampled latch circuitry (e.g., comprising the transistors 431P, 431N, 433P, and 433N), latch reset mechanism (e.g., comprising the switch 437, 439P, 439N, etc.), and/or the like.

Figure 5:
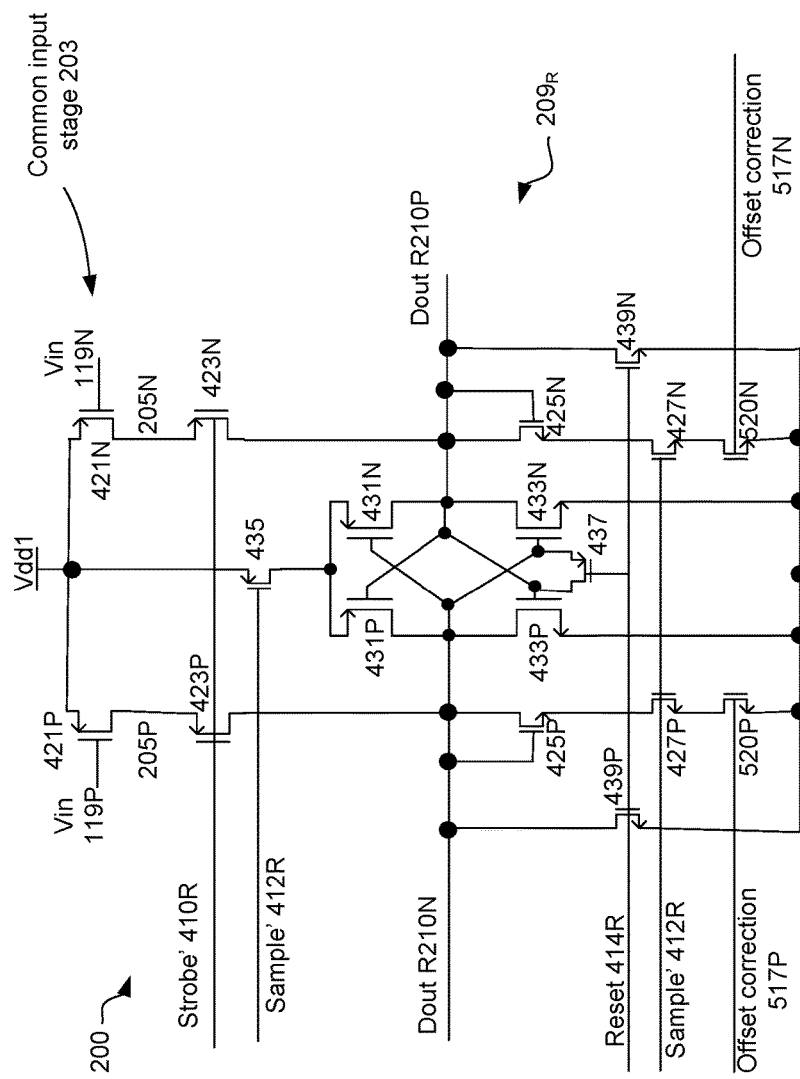
FIG. 5 illustrates an example implementation of the ADC depicted in FIG. 4, according to some embodiments.

FIG. 5 illustrates an example implementation of the ADC 200 depicted in FIG. 4, according to some embodiments. Specifically, FIG. 5 illustrates the common input stage 203 and the circuitry $209_R$ of FIG. 4.

The circuitry $209_R$ in FIGS. 4 and 5 are at least in part similar. However, some of the components of FIG. 4 are replaced by other corresponding components in FIG. 5. For example, the switches 423P, 423N of FIG. 4 are replaced by corresponding transistors in FIG. 5, which are also labeled similarly (e.g., transistors 423P, 423N) in FIG. 5. Also, the switch 435 of FIG. 4 is replaced by a corresponding transistor in FIG. 5, which is also labeled similarly (e.g., transistor 435) in FIG. 5. Furthermore, the supply voltages Vdd1 and Vdd2 in FIG. 4 are combined (e.g., the transistor 435 now receives the supply voltage Vdd1). The switch 437 of FIG. 4 is replaced by a corresponding transistor in FIG. 5, which is also labeled similarly (e.g., transistor 437) in FIG. 5. The switches 439P, 439N of FIG. 4 are replaced by corresponding transistors in FIG. 5, which are also labeled similarly (e.g., transistors 439P, 439N) in FIG. 5. The switches 427P, 427N of FIG. 4 are replaced by corresponding transistors in FIG. 5, which are also labeled similarly (e.g., transistors 427P, 427N) in FIG. 5. Furthermore, although not illustrated in FIG. 4, in FIG. 5 transistors 520P and 520N are respectively coupled between the transistors 427P, 427B and the ground. The loads 425P and 425N of FIG. 4 are replaced by corresponding transistors 425P and 425N (e.g., diode connected transistors 425P and 425N) in FIG. 5, although the loads may be of any other appropriate type.

FIGS. 6A-6E illustrate example operations of the ADC 200 depicted in FIGS. 2-5, according to some embodiments. The components illustrated in FIGS. 6A-6E are similar to those illustrated in FIG. 5. Also, each of FIGS. 6A-6E illustrate a corresponding phase of operation of the ADC

200. FIGS. 6A-6E, in combination, illustrate a comparison and latching operation performed by the circuitry 209$_R$ of the ADC 200.

In each of FIGS. 6A-6E, at least some of the signal lines being currently active (e.g., currently transmitting current, or at a high non-zero potential) are illustrated using dotted line, and at least some of the remaining signal lines are illustrated using solid lines.

Referring now to FIG. 6A, this figure illustrates an unconnected phase of the circuitry 209$_R$. During this phase, the common input stage 203 is connected to a different circuitry 209 (e.g., one of circuitries 209$_{R-1}$, 209$_{R-2}$, . . . 209$_1$, but disconnected from circuitry 209$_R$). In some embodiments, during the unconnected phase, the strobe' 410R causes the switches 423P and 423N to be off, thereby disconnecting the circuitry 209$_R$ from the common input stage 203. The reset signal 424R switches on the switches 439P, 439N, and 437, thereby coupling the Dout R210P, R210N to ground, as illustrated in FIG. 6A. The switch 437 coupling the Dout R210P and R210N improves differential reset of the two differential outputs. Thus, in FIG. 6A, the latch comprising the transistors 431P, 431N, 433P, and 433N is reset (e.g., both outputs Dout R210P, R210N zero), and the circuitry 209$_R$ is not connected to the common input stage 203.

Figure 6B:
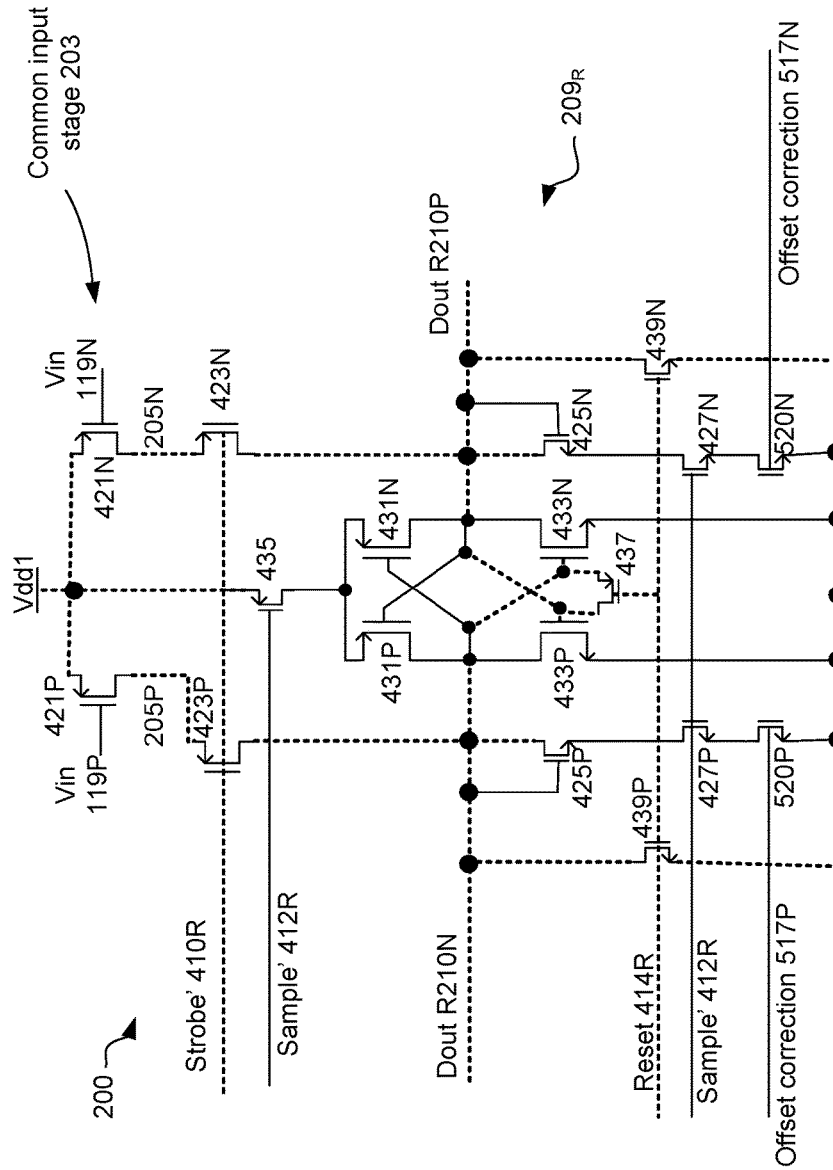

Referring now to FIG. 6B, this figure illustrates a reset phase of the circuitry 209$_R$. This phase depicted in FIG. 6B commences once a comparison operation of a previous circuitry (e.g., circuitry 209$_1$ during a previous comparison operation, during a sample and hold of a previous instance of the input voltage Vin) is completed, and the comparison operation of the circuitry 209$_R$ is set to begin.

During the reset phase of FIG. 6B, the strobe' 410R causes the switches 423P and 423N to be ON, thereby connecting the circuitry 209$_R$ to the common input stage 203. For example, the common input stage 203 is now connected to the reset latch. This, for example, allows for the reset of memory on the input differential pair (e.g., transistors 421P, 421N) of the common input stage 203 from a previous comparison operation. Thus, in FIG. 6B, the common input stage 203 (e.g., the inputs 205) are reset, the outputs Dout R210P and R210N are reset, and the latch of the circuitry 209$_R$ (e.g., comprising the cross coupled transistors 431P, 431N, 433P, 433N) is also reset (e.g., coupled to the ground terminal). In FIG. 6B, the load transistors 425P and 425N are off, as the transistors 427P and 427N are off (e.g., as the sample' 412R is inactive).

Figure 6C:
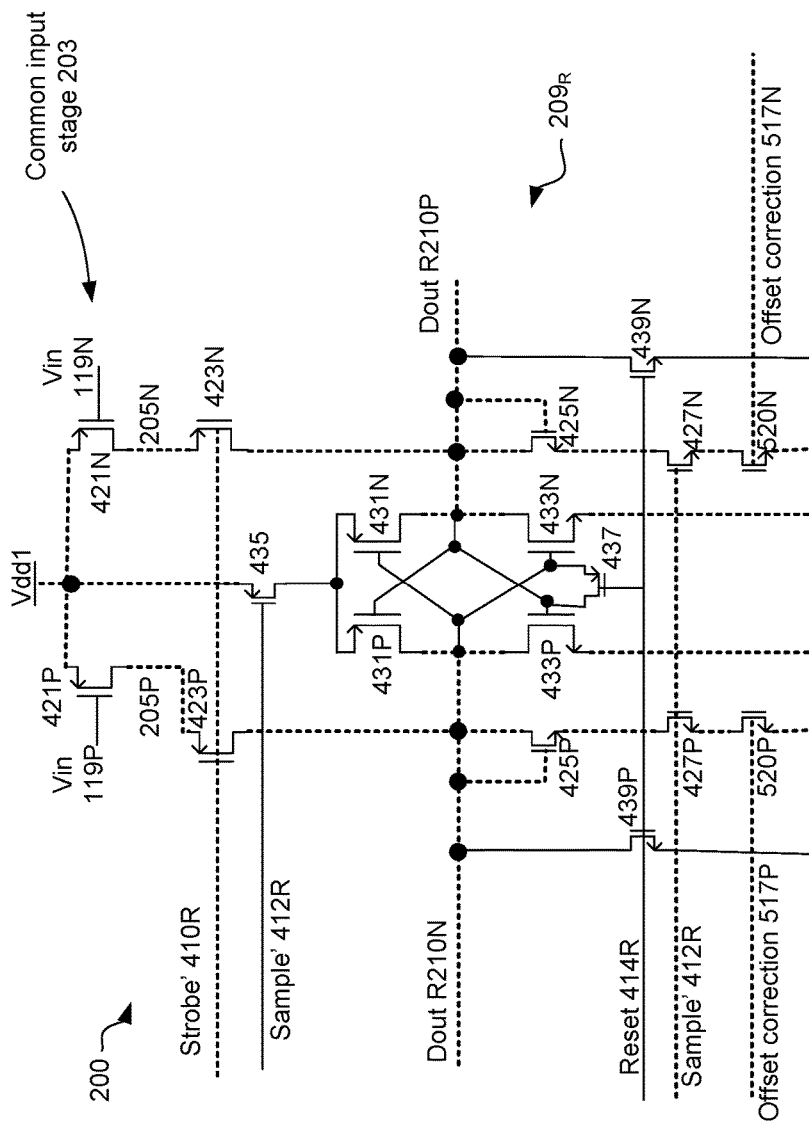

Referring now to FIG. 6C, this figure illustrates an amplification or gain phase of the circuitry 209$_R$. During this phase, a combination of the common input stage 203 and the circuitry 209$_R$ behaves as an amplifier, e.g., by amplifying a difference between the input voltages Vin 119P and Vin 119N in the output Dout R210P and R210N. The reset 414R (which was active in FIG. 6B) is now inactive in FIG. 6C, and the sample' 412R is now active, thereby turning on the switches 427P and 427N. Also, the offset correction 517 is active, thereby turning on the transistors 520P and 520R. Thus, current may flow through the loads 425P and 425N. In some embodiments, part of the current may also flow through transistors 433P and 433N.

For example, if the voltage Vin 119P is higher than the voltage Vin 119N, such a voltage difference is amplified in the output Dout R210P and R210N (e.g., R210P may be higher than R210N). On the other hand, if the voltage Vin 119P is lower than the voltage Vin 119N, such a voltage difference is amplified in the output Dout R210P and R210N (e.g., R210P may be lower than R210N).

Relative values of the Dout R210P and R210N may be an indication of whether Vin 112 is higher, or lower, than the output of the DAC 116. For example, as differential signaling is being employed, voltage Vin 119P being higher than the voltage Vin 119N implies that the signal 119 is greater than zero and that Vin 112 is higher than the output of the DAC 116, and vice versa.

In an example, the presence of the gain stage makes the circuitry 209$_R$ less susceptible to noise-speed tradeoff, since the noise in amplification phase may not depend on the amplification time (e.g., to a first order and assuming sufficient bandwidth). For example, if sufficient gain is provided, then an integration phase (discussed with respect to FIG. 6D) may no longer limit the noise.

In some embodiments, there may be offset in various transistors of the circuitry 209 (e.g., offsets between transistors 425P and 425N, offsets between transistors 421P and 421N, etc.). In some embodiments, the offset of the comparator may be calibrated using a two-stage mechanism that initially calibrates the common offset due to the differential trans-conductance amplifier (e.g., offsets between transistors 421P and 421N), then calibrates the individual offsets per comparator bit. This may be supported by the circuit implementation as follows.

In some embodiments, the common offset calibration may be performed using a dedicated trans-conductance stage (not illustrated in the figures) in parallel with the common trans-conductance input stage 203. The per-bit offset calibration may be performed, for example, by modulating the switched load for each bit using the offset correction signal 517 and the transistors 520P, 520N, e.g., as illustrated in FIG. 6C.

Merely as an example, eight offset correction controls may be used—one for the shared trans-conductance stage (e.g., which may be a pseudo differential pair in parallel with the common input stage 203), and seven for the individual latches (e.g., where smaller correction magnitudes may be used). The offset introduced by the latch transistors may be reduced due to the common input, while the offset introduced by the input trans-conductance devices (e.g., offset introduced by the transistors 421P, 421N, which may dominate the offset) presents a common offset component for all the stages.

Figure 6D:
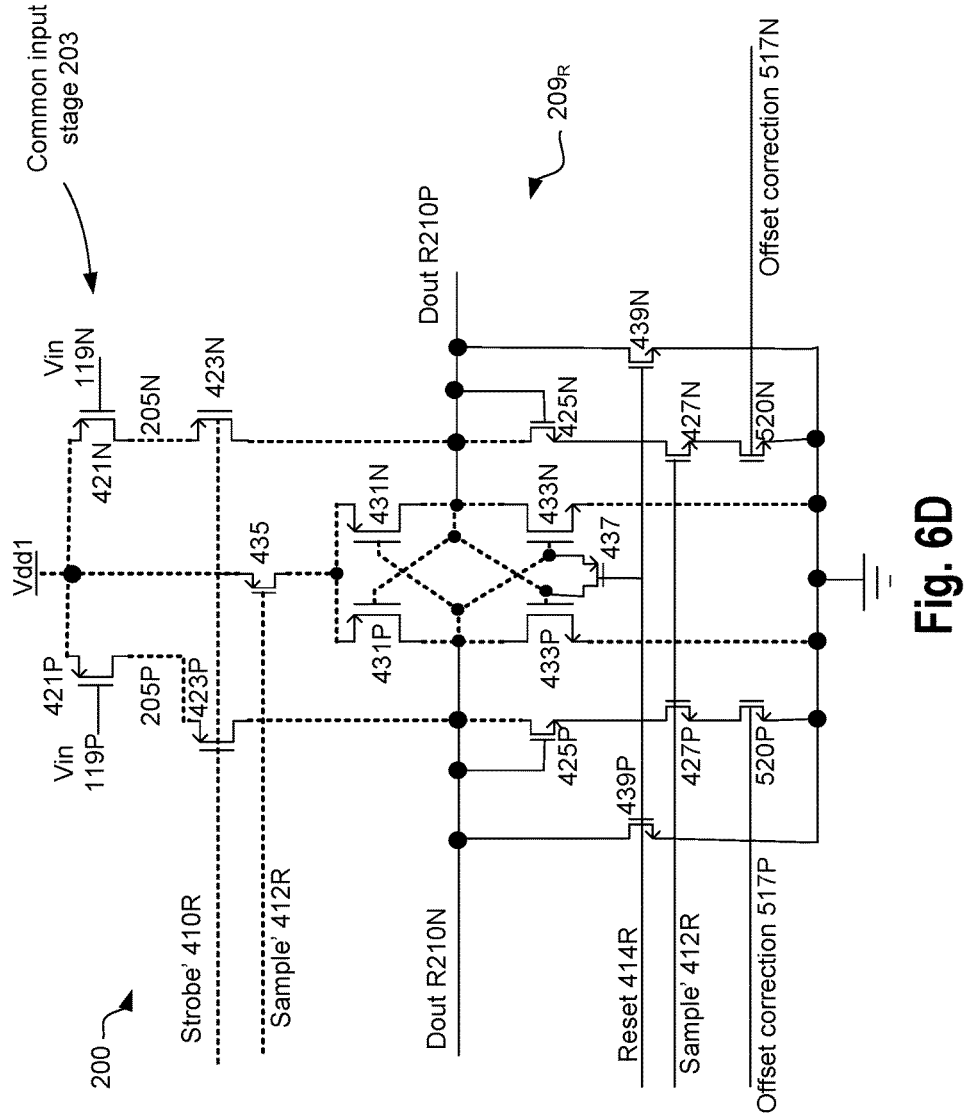

Referring now to FIG. 6D, illustrated is an integrated phase of the circuitry 209$_R$. For example, during this phase, the load transistors 425P and 425N are off (e.g., these transistors are disconnected as the sample' 412R is deactivated in FIG. 6D, and the transistors 427P and 427N are now off). Thus, the load transistors 425P and 425N are disconnected. The latch comprising the transistors 431P, 431N, 433P, and 433N are now activated (e.g., by activating the sample' 412R signal, which turns on the transistor 435). The transistors 431P, 431N, 433P, and 433N maintain and regenerate (e.g., amplify) the output Dout R210P and R210N, such that differences between R210P and R210N is maintained and amplified or regenerated. For example, as the common input sage 203 is still coupled to the Dout R210P and R210N, the difference between R210P and R210N is maintained and regenerated (e.g., the differences is maintained and magnified) by the transistors 431P, 431N, 433P, and 433N.

Figure 6E:
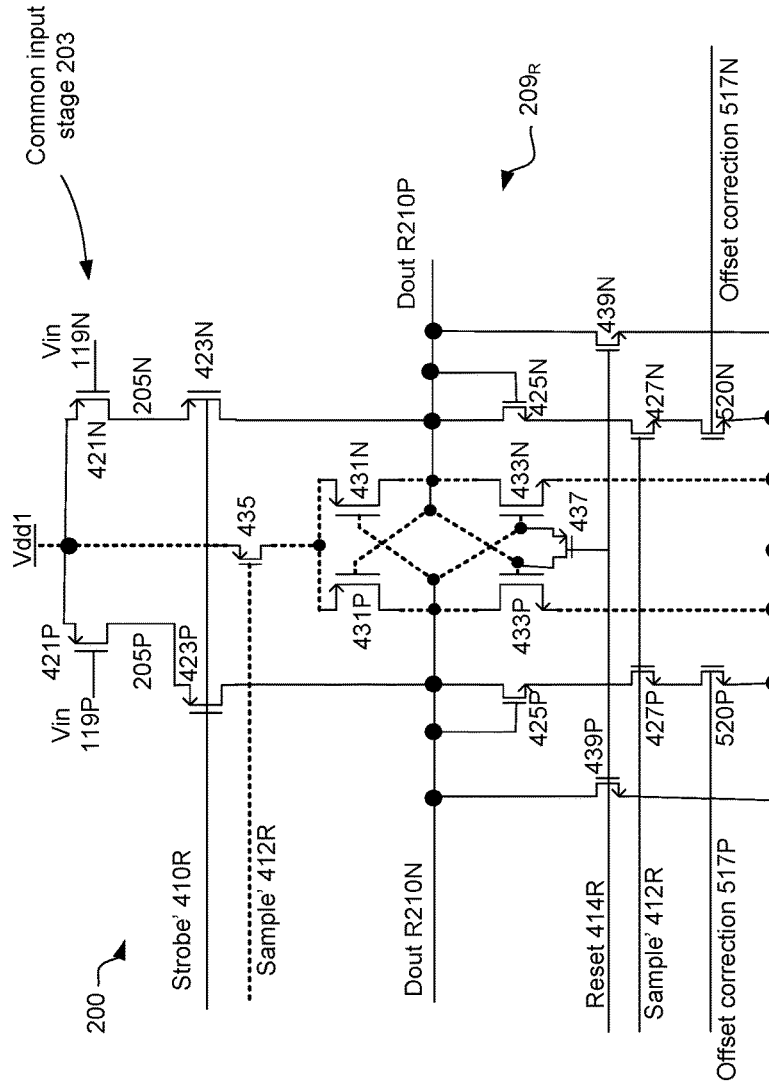

Referring now to FIG. 6E, illustrated is a latching phase of the circuitry 209$_R$. During this phase, the common input stage 203 gets disconnected from the Dout R210P and R210N (e.g., as the strobe 410R is deactivated, thereby switching off the transistors 423P and 423N). The transistors 431P, 431N, 433P, and 433N (e.g., the latch) continues to evaluate the difference between Dout R210P and R210N, and the difference in maintained. Thus, in this stage, the circuitry $209_R$ acts as a memory to preserve the difference between Dout R210P and R210N, thereby preserving the value of the $R^{th}$ bit of Dout 210.

At FIG. 6E, the comparison cycle of the circuitry $209_R$ is complete, and another circuitry 209 (e.g., the circuitry $209_{R-1}$) is now activated. For example, referring to FIG. 3, the circuitry $209_R$ indicates a completion of the comparison operation to the circuitry $209_{R-1}$, via the comparison completion indication circuitry 303_R_R-1. Based on receiving such an indication, the circuitry $209_{R-1}$ starts the various phases of operation, e.g., similar to those discussed with respect to FIGS. 6B-6E.

Figure 7:
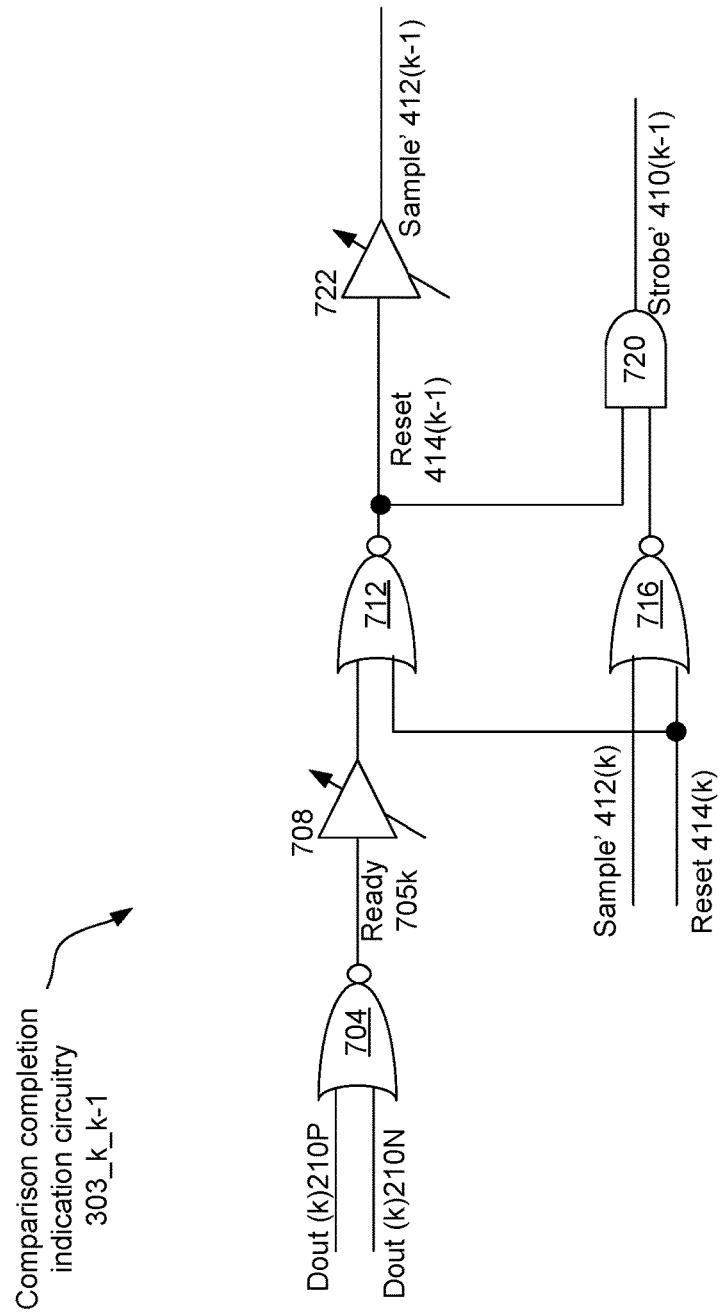
FIG. 7 illustrates an example implementation of a comparison completion indication circuitry of FIG. 3, according to some embodiments.

FIG. 7 illustrates an example implementation of a comparison completion indication circuitry 303 (e.g., comparison completion indication circuitry 303_k_k-1) of FIG. 3, according to some embodiments. Thus, the comparison completion indication circuitry 303 illustrated in FIG. 7 is from a circuitry $209_k$ to $209_{k-1}$, where k may be an index value between 1, ..., R. Thus, the comparison completion indication circuitry 303 of FIG. 7 may be coupled between any two consecutive or adjacent circuitries 209 of the ADC 200, as discussed with respect to FIG. 3.

In some embodiments, the comparison completion indication circuitry 303 comprises a NOR gate 704 receiving the Dout (k)210P and (k)210N. In an example, when the comparison and latching of the circuitry $209_k$ is complete, one of the outputs Dout (k)210P and (k)210N may be high, and the other may be low. Thus, an output ready 705k of the NOR gate 704 may be high if the comparison and latching of the circuitry $209_k$ is complete. Thus, the high value of the output ready 705k may initiate activation of the next circuitry $209_{k-1}$. In some embodiments, the ready signal 705k may be delayed using an adjustable delay 708, e.g., to allow the output of the DAC 116 and/or the input of the differential input of the comparator of the circuitry $209_k$ to sufficiently settle down, before initiating the next comparison operation in the circuitry $209_{k-1}$. The ready 705k is received by a NOR gate 712, which also receives the reset signal 414(k). The output of the NOR gate 712 is the reset signal 414(k-1), e.g., the reset signal for the next circuitry $209_{k-1}$. In some embodiments, the reset signal 414(k-1) is delayed by an adjustable delay 722 to obtain the sample' 412(k-1) signal for the next circuitry $209_{k-1}$. Thus, the sample' signal of a circuitry 209 may be a delayed version of the corresponding reset signal of the circuitry 209.

In some embodiments, a NOR gate 716 may receive the reset 414(k) and the sample' 412(k). An AND gate 720 may receive an output of the NOR gate 716 and an output of the NOR gate 712. The AND gate 720 may output the strobe' signal 410(k-1) for the next circuitry $209_{k-1}$. Thus, the strobe' signal 410(k-1) of the next circuitry $209_{k-1}$ is initiated when the previous circuitry $209_k$ is sampled and terminated.

In some embodiments, the comparison completion indication circuitry 303 illustrated in FIG. 7 is merely an example. For example, the logical gates used may change, e.g., based on polarities and/or delay requirements of the circuitries 209.

Figure 8:
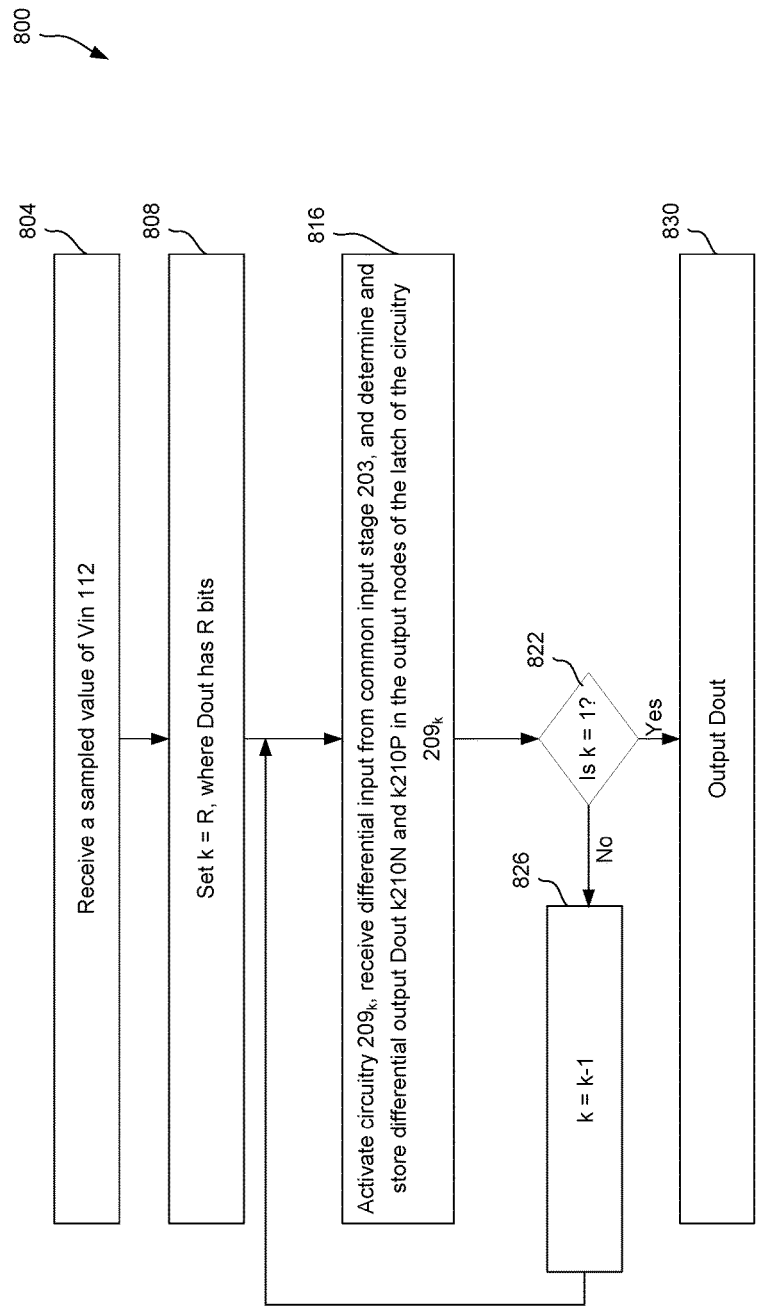
FIG. 8 illustrates a flowchart depicting a method for operating an ADC using parallel comparison and latch circuitries and a common input stage, according to some embodiments.

FIG. 8 illustrates a flowchart depicting a method 800 for operating a ADC (e.g., ADC 200) using parallel comparison and latch circuitries (e.g., circuitry 209) and a common input stage (e.g., common input stage 203), according to some embodiments. The illustrated embodiments can be performed in a different order, and some actions/blocks may be performed in parallel. Some of the blocks and/or operations listed in FIG. 8 may be optional in accordance with certain embodiments. The numbering of the blocks presented is for the sake of clarity and is not intended to prescribe an order of operations in which the various blocks must occur.

The method 800 commences at 804, where a sampled value of Vin 112 (e.g., as sampled by the sample and hold circuit 114) is received by the ADC 200. At 808, an index k is set to R, where output Dout 210 of the ADC 200 has R bits. The index k may vary from R, (R-1), ..., 1. Thus, at an initial iteration of the method 800, the index k may be initialized corresponding to a MSB (e.g., the $R^{th}$ bit) of the Dout 210.

At 816, during an iteration of the method 800, the circuitry $209_k$ may be activated. The circuitry $209_k$ may receive differential input 205 from the common input stage 203. The values of Dout k210P and k210R may be amplified, regenerated, and latched (e.g., as discussed with respect to FIGS. 6B-6E) at the output nodes of the latch of the circuitry $209_k$. Merely one of k210P and k210R may be equal to a logical high and another of the k210P and k210R may be logical low (e.g., based on the comparison operation performed by the circuitry $209_k$). For example, if k210P is higher than k210R, then the $k^{th}$ bit may be determined to be logical one; and if k210P is lower than k210R, then the $k^{th}$ bit may be determined to be logical zero. The differential output signals may be latched and preserved by the latch of the circuitry $209_k$.

Once the comparison and latching operation of the circuitry $209_k$ is complete, the method may proceed to 822, where it may be determined if k=1 (e.g., if all the circuitries $209_R$, $209_{R-1}$, ..., $209_1$ have been sequentially activated). If not (e.g., "No" at 822), at 826, k may be decremented (e.g., k=k-1), and the method 800 may loop back to block 812. For example, the comparison completion indication circuitry 303_k_k-1 may initiate the control signals (e.g., strobe signal, reset signal, sample signal, etc.) for the next circuitry $209_{k-1}$.

If "Yes" at 822 (e.g., if all the circuitries $209_R$, $209_{R-1}$, ..., $209_1$ have been sequentially activated), at 830, Dout 210 may be output by the ADC 200. For example, output of a latch from a circuitry 209 may be used to form a corresponding bit of the Dout 210.

Various embodiments and examples discussed herein proposes a ADC (e.g., ADC 200) based on multiple parallel comparison and latch circuitries 209. In some embodiments, the ADC 200 may behave as a multiple comparator SAR architecture, where each circuitry 209 serves as a comparator and memory bit, overcoming the need for dedicated SAR registers or complex register logic. Thus, for example, the outputs Dout R210P and R210N of the circuitry $209_R$ are maintained or preserved by the latch of the circuitry $209_R$. The circuitry $209_R$ and the common input stage 203 act as a comparator (e.g., as it is comparing 119P and 119N) and a memory bit (e.g., as the latch is maintaining the outputs Dout R210P and R210N).

In some embodiments, the ADC 200 features a novel comparator comprising a common input transconductance amplifier stage (e.g., common input stage 203), multiple switchable latches (e.g., circuitries 209, whose number may be equal to the number of output Dout 210), and asynchronous logic to trigger each comparison (e.g., circuitry 303 discussed with respect to FIGS. 3 and 7). In some embodiments, the ADC 200 may implement a common-mode and per bit calibration scheme, allowing for batch and fine calibration of each multi-comparator (e.g., as discussed with respect to the offset calibration signal 517). In some embodiments, the comparison operation may be characterized by one or more phases, e.g., (a) an unconnected phase, (b) a reset phase, (c) an amplification phase (also referred to as a gain phase), (d) an integration phase, and (e) a latching phase. In some embodiments, the reset, amplification, integration, and/or the latching phases may be combined for even faster operation. This may combine the operations of per-amplification, integration and latching into a single unit.

In some embodiments, the ADC 200 has various technical effects. For example, when compared to a single-comparator based SAR, the main advantages of a single-comparator based SAR are maintained in the ADC 200. Some of the advantages of the ADC 200 may be inclusion of a single common differential pair input stage 203, which may allow for lower loading on the sample and hold circuitry 114 and/or the DAC 116. On the other hand, various disadvantages of a single comparator ADC are overcome in the proposed ADC 200. For example, the parallel topology of the ADC 200 (e.g., where the circuitries 209 are sequentially activated, and completion of compare and latch operation in one circuitry $209_k$ triggers activation of the next circuitry $209_{k-1}$) may allow for consecutive sampling of multiple bits, e.g., without needing to wait for a reset of the latch. Additionally, having a separate comparator per bit of the Dout 210 may allow for a direct and fast control of the DAC 116, bypassing any complex logic.

An aspect when comparing the ADC 200 with prior art ADCs is the kickback effect. A disadvantage of a prior art Avalanche SAR is due to the use of multiple separate comparators. For example, one of the disadvantages may include one or more of kickback resampling. Kickback resampling may occur when one comparator samples reset kickback of another comparator. This issue may be significantly improved by the use of the common input stage 203.

In an example, one of the disadvantages of a prior art Avalanche SAR may include sample and hold and/or DAC loading. In some embodiments, the use of a single differential pair input stage 203 in the ADC 200 may reduce loading of the sample and hold circuitry 114, and the DAC 116. In some embodiments, the use of a single differential pair input stage 203 in the ADC 200 means that the input stage 203 can be sized significantly larger (e.g., compared to that of a classical multi-comparator architecture, where each comparator has a corresponding input stage). The relatively large common input stage 203 may reduce significantly thermal and flicker noise, and offsets, while still maintaining a lower load on the DAC and/or the sample and hold circuitry 114.

In an example, a disadvantage of a prior art Avalanche SAR may include a need for correction of multiple uncorrelated offsets. In an example, a presence of multiple uncorrelated offsets may occur because multiple comparators are used, where each of them has its own random offset. The proposed topology of the ADC 200 may reduce this complexity, since with proper design, most of the offset may generate in the differential pair of transistors in the common input stage 203. This allows for bulk correction of the offset that is common to all the bits (e.g., common to all the circuitries 209), while requiring less correction for each bit separately.

Figure 9:
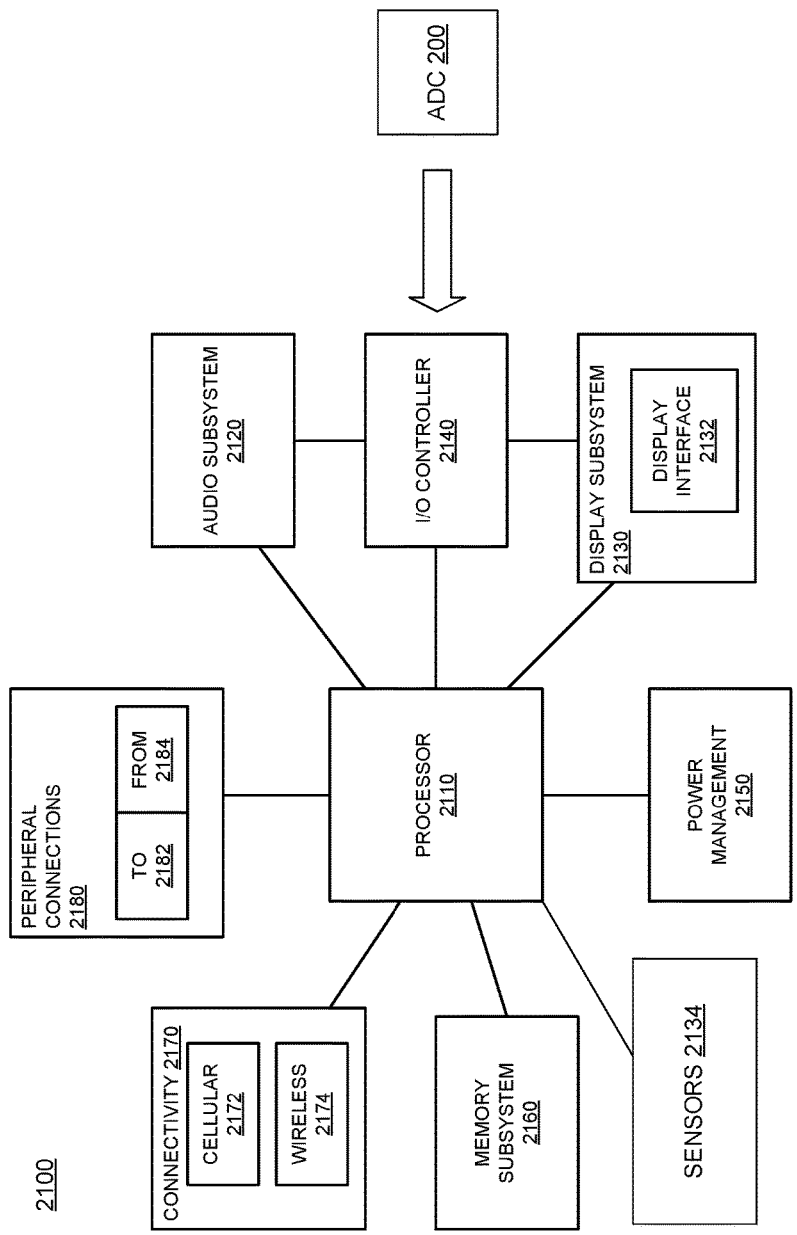
FIG. 9 illustrates a computing device or a SoC (System-on-Chip), where the ADC discussed with respect to FIGS. 2-8 may be used, according to some embodiments.

FIG. 9 illustrates a computing device or a SoC (System-on-Chip) 2100, where the ADC 200 discussed with respect to FIGS. 2-8 may be used, according to some embodiments. It is pointed out that those elements of FIG. 9 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may comprise one or more sensors 2134, e.g., low power sensors, low resolution sensors, a heart monitor sensor, one or more sensors associated with a vehicle, pressure sensors, general use temperature sensors.

The computing device 2100 may comprise the ADC 200. For example, any appropriate component (e.g., a SerDes, an Ethernet PHY, a processor, a memory, etc.) of the computing device 2100 may comprise or be coupled to the ADC 200. In some embodiments, the ADC 200 may convert an analog output of a sensor 2134 to a corresponding digital value. The ADC 200 may operate based on a common input stage 203 and a plurality of comparison and latch circuitries 209, as discussed with respect to FIGS. 2-8.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An Analog to Digital converter (ADC) comprising:
a first circuitry to sample an analog input signal;
a summation block to iteratively generate a subtraction signal, which is based on a difference between the analog input signal and a feedback signal;
a second circuitry to receive the subtraction signal; and
a plurality of comparison and latch circuitries arranged in parallel, wherein individual ones of the plurality of parallel comparison and latch circuitries is to sequentially receive an output of the second circuitry.

2. The ADC of claim 1, wherein the plurality of comparison and latch circuitries is to generate a digital output that is a digital representation of the analog input signal.

3. The ADC of claim 2, wherein a number of comparison and latch circuitries in the plurality of comparison and latch circuitries is equal to a number of bits in the digital output.

4. The ADC of claim 2, wherein at least one comparison and latch circuitry is to store a corresponding bit of a plurality of bits of the digital output.

5. The ADC of claim 2, wherein the plurality of comparison and latch circuitries include a first comparison and latch circuitry and a second comparison and latch circuitry, and wherein:
the first comparison and latch circuitry is to perform a comparison operation to determine a value of a first bit of the digital output;
the second comparison and latch circuitry is to perform a comparison operation to determine a value of a second bit of the digital output; and
the ADC comprises a comparison completion indication circuitry to trigger initiation of the comparison operation of the second comparison and latch circuitry, in response to a completion of the comparison operation and a latching operation in the first comparison and latch circuitry.

6. The ADC of claim 5, wherein the first bit and the second bit are two immediate adjacent bits in the digital output, and wherein the first bit has higher weight than the second bit in the digital output.

7. The ADC of claim 2, wherein the plurality of comparison and latch circuitries include:
a first comparison and latch circuitry; and
a second comparison and latch circuitry,
and wherein:
the first comparison and latch circuitry is to perform a comparison operation to update a first value of a Digital to Analog Converter (DAC);
the second comparison and latch circuitry is to perform a comparison operation to update a second value of the DAC, and
the DAC is to generate the feedback signal.

8. The ADC of claim 2, wherein the plurality of comparison and latch circuitries include:
a first comparison and latch circuitry; and
a second comparison and latch circuitry,
and wherein:
the first comparison and latch circuitry is to perform a comparison operation to update a first value of a Digital to Analog Converter (DAC);
the second comparison and latch circuitry is to perform a comparison operation to update a second value of the DAC, and
the ADC comprises a logic to synchronously trigger initiation of the comparison operation of the second comparison and latch circuitry.

9. The ADC of claim 2, wherein an individual one of the comparison and latch circuitries comprises:
one or more switches to selectively couple the common input stage to the first comparison and latch circuitry;
one or more switchable loads;
a latch to regenerate and maintain a result of a comparison operation in the first comparison and latch circuitry; and
a latch reset mechanism to reset the latch prior to the comparison operation.

10. The ADC of claim 9, wherein the latch comprises:
a first pair of cross-coupled transistors comprising a first transistor and a second transistor; and
a second pair of cross-coupled transistors comprising a third transistor and a fourth transistor, wherein the first transistor is coupled in series with the third transistor, wherein the second transistor is coupled in series with the fourth transistor, wherein a first output node is coupled between the first and third transistors, and wherein a second output node is coupled between the second and fourth transistors.

11. The ADC of claim 10, wherein the latch reset mechanism comprises one or more of:
a first switch to selectively couple the first output node to a ground terminal;
a second switch to selectively couple the second output node to the ground terminal; or
a third switch to selectively couple the first and second output nodes.

12. The ADC of claim 9, wherein the latch comprises:
a first inverter and a second inverter arranged in a clocked back-to-back invertor arrangement.

13. A system comprising:
a memory to store instructions;
a processor coupled to the memory, the processor to execute the instructions;
a wireless interface to allow the processor to communicate with another system; and
an Analog to Digital converter (ADC) coupled to at least one of the memory, the processor, the wireless interface, or another component of the system, the ADC comprising:
a plurality of comparison and latch circuitries arranged in parallel, wherein the plurality of comparison and latch circuitries is to generate a digital output that is a digital representation of an analog input signal, wherein an individual comparison and latch circuitry is to determine a corresponding bit of a plurality of bits of the digital output, and wherein the plurality of comparison and latch circuitries comprises at least a first comparison and latch circuitry and a second comparison and latch circuitry, and a comparison completion indication circuitry to trigger activation of the second comparison and latch circuitry, in response to a completion of a comparison operation and a latching operation in the first comparison and latch circuitry.

14. The system of claim 13, wherein the comparison completion indication circuitry is to generate one or more control signals for activation and operation of the second comparison and latch circuitry, in response to differential outputs of the first comparison and latch circuitry being latched in the first comparison and latch circuitry.

15. The system of claim 14, wherein the comparison completion indication circuitry comprises a NOR logical gate to:
receive the two outputs of the first comparison and latch circuitry; and
generate a ready signal, where the ready signal is to trigger activation of the second comparison and latch circuitry after a configurable delay.

16. The system of claim 15, wherein the ready signal is to initially activate a reset of the second comparison and latch circuitry, and subsequently trigger activation of a comparison operation in the second comparison and latch circuitry.

17. The system of claim 13, wherein:
the first comparison and latch circuitry is to perform the comparison operation to determine a value of a first bit of the digital output;
the second comparison and latch circuitry is to perform the comparison operation to determine a value of a second bit of the digital output;
the first bit and the second bit are two immediate adjacent bits in a digital output of the ADC; and
the first bit has higher weight than the second bit in the digital output.

18. An apparatus comprising:
a first circuitry to receive a first input signal and a second input signal; and
a plurality of second circuitries arranged in parallel, wherein individual ones of the plurality of second circuitries is to sequentially receive an output of the first circuitry, and wherein a circuitry of the plurality of second circuitries comprise:
one or more switches to selectively couple the first circuitry;
one or more switchable loads, wherein the first circuitry and the one or more switchable loads is to compare the first and second input signals, and output the comparison results in a first output node and a second output node;
a latch to regenerate and maintain the comparison result in the first and second output nodes; and
a latch reset mechanism to reset the latch prior to the comparison.

19. The apparatus of claim 18, wherein the first circuitry comprises:
a first transistor coupled between a supply and a first switch of the one or more switches, the first transistor being controlled by the first input signal; and
a second transistor coupled between the supply and a second switch of the one or more switches, the second transistor being controlled by the second input signal.

20. The apparatus of claim 19, wherein the one or more switchable loads comprises:
a first diode connected transistor coupled between the first switch and a ground terminal; and
a second diode connected transistor coupled between the second switch and the ground terminal.

21. The apparatus of claim 20, wherein the circuitry of the plurality of second circuitries further comprise:
the first output node coupled between the first switch and the first diode connected transistor;
the second output node coupled between the second switch and the second diode connected transistor; and
a latch coupled to the first and second output nodes, wherein the latch is to regenerate differential output signal in the first and second output nodes, and to maintain the signals in the first and second output nodes.

22. The apparatus of claim 18, wherein the first and second input signals are a differential input signal, and the first output node and the second output node is to output a differential output signal.

23. The ADC of claim 1, wherein:
the plurality of comparison and latch circuitries include:
a first comparison and latch circuitry, and a second comparison and latch circuitry; and
individual ones of the plurality of parallel comparison and latch circuitries is to sequentially receive the output of the second circuitry such that:
the second comparison and latch circuitry is to receive the output of the second circuitry subsequent to the output of the second circuitry being received by the first comparison and latch circuitry.

24. An apparatus comprising:
a plurality of comparison and latch circuitries, wherein an output of an individual one of the plurality of comparison and latch circuitries is to sequentially trigger initiation of a comparison and latch operation by a subsequent comparison and latch circuitry of the plurality of comparison and latch circuitries; and
a trans-conductance input circuitry coupled to the plurality of comparison and latch circuitries, wherein the trans-conductance input circuitry is to receive a differential input and generate current for one of the individual one of the plurality of comparison and latch circuitries.

25. The apparatus of claim 24, wherein the trans-conductance input circuitry is a single differential stage shared by the plurality of comparison and latch circuitries.

* * * * *

UNITED STATES PATENT AND TRADEMARK OFFICE
CERTIFICATE OF CORRECTION

PATENT NO. : 10,340,938 B1  
APPLICATION NO. : 15/961460  
DATED : July 2, 2019  
INVENTOR(S) : Roee Eitan et al.

Page 1 of 1

It is certified that error appears in the above-identified patent and that said Letters Patent is hereby corrected as shown below:

In the Claims

Column 20, Line 15: insert a --;-- between "DAC" and "and"

Column 20, Line 21: remove "the" and replace with "a" between "couple" and "common"

Column 21, Lines 50-51: remove "the" and replace with "a" between "output" and "comparison;" and remove the "s" from the word "results"

Signed and Sealed this  
Twenty-fourth Day of November, 2020

Andrei Iancu  
*Director of the United States Patent and Trademark Office*